(12) United States Patent
Lee (10) Patent No.: US 7,453,736 B2
(45) Date of Patent: Nov. 18, 2008

(54) METHODS OF ERASING AND DESIGNING ELECTRICALLY ERASABLE CHARGE TRAP NONVOLATILE MEMORY CELLS HAVING ERASE THRESHOLD VOLTAGE THAT IS HIGHER THAN AN INITIAL THRESHOLD VOLTAGE

(75) Inventor: Chang-Hyun Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 4 days.

(21) Appl. No.: 11/611,972

(22) Filed: Dec. 18, 2006

(65) Prior Publication Data
US 2007/0103990 A1 May 10, 2007

Related U.S. Application Data

(63) Continuation of application No. 11/128,038, filed on May 12, 2005, now Pat. No. 7,170,795, which is a continuation of application No. 10/401,372, filed on Mar. 28, 2003, now Pat. No. 6,947,330.

(30) Foreign Application Priority Data
May 8, 2002 (KR) .......................... 2002-0025195

(51) Int. Cl.
G11C 11/34 (2006.01)
G11C 16/04 (2006.01)

(52) U.S. Cl. ............................ 365/185.29; 365/185.24; 365/185.28; 365/185.3; 365/185.33

(58) Field of Classification Search ............ 365/185.24, 365/185.29, 185.33, 185.28
See application file for complete search history.

(56) References Cited

U.S. PATENT DOCUMENTS

| | | | |
|---|---|---|---|
| 5,099,297 A | 3/1992 | Hazani | |
| 5,132,935 A | 7/1992 | Ashmore, Jr. | |
| 5,396,459 A * | 3/1995 | Arakawa | ............... 365/185.29 |
| 5,400,286 A | 3/1995 | Chu et al. | |

(Continued)

FOREIGN PATENT DOCUMENTS

KR 10-0244861 B1 11/1999

OTHER PUBLICATIONS

Sharma, *Semiconductor Memories: Technology, Testing, and Reliability*, IEEE Press, 1997, pp. 104-116.

*Primary Examiner*—Ly D Pham
(74) *Attorney, Agent, or Firm*—Myers Bigel Sibley & Sajovec, P.A.

(57) ABSTRACT

An electrically erasable charge trap nonvolatile memory cell has an initial threshold voltage, a program voltage that is higher than the initial threshold voltage, and an erase threshold voltage that is lower than the program threshold voltage but is higher than the initial threshold voltage. The programmed electrically erasable charge trap nonvolatile memory cells may be erased by applying an erase voltage for a time interval that is sufficient to lower the threshold voltage the transistor from a program threshold voltage to an erase threshold voltage that is lower than the program threshold voltage, but is higher than the initial threshold voltage. The time interval may be determined by repeatedly performing an endurance test using a time interval that is increased or decreased from an initial time interval, to obtain the time interval that meets an endurance specification, or allows a read to be performed successfully.

27 Claims, 4 Drawing Sheets

U.S. PATENT DOCUMENTS

| | | | |
|---|---|---|---|
| 5,537,358 A | 7/1996 | Fong | |
| 5,600,593 A * | 2/1997 | Fong | 365/185.19 |
| 5,648,930 A | 7/1997 | Randazzo | |
| 5,694,357 A | 12/1997 | Mori | |
| 5,699,298 A | 12/1997 | Shiau et al. | |
| 5,790,460 A | 8/1998 | Chen et al. | |
| 5,815,445 A * | 9/1998 | Hull et al. | 365/189.06 |
| 5,886,905 A | 3/1999 | Yokozawa | |
| RE36,210 E * | 5/1999 | Santin | 365/185.19 |
| 5,923,589 A | 7/1999 | Kaida et al. | |
| 5,999,444 A | 12/1999 | Fujiwara et al. | |
| 6,026,026 A | 2/2000 | Chan et al. | |
| 6,054,732 A | 4/2000 | Ho et al. | |
| 6,108,263 A | 8/2000 | Bauser et al. | |
| 6,134,141 A | 10/2000 | Wong | |
| 6,160,739 A | 12/2000 | Wong | |
| 6,160,740 A | 12/2000 | Cleveland | |
| 6,169,693 B1 | 1/2001 | Chan et al. | |
| 6,188,609 B1 | 2/2001 | Sunkavalli et al. | |
| 6,222,768 B1 | 4/2001 | Hollmer et al. | |
| 6,243,298 B1 | 6/2001 | Lee et al. | |
| 6,261,884 B1 | 7/2001 | Ho et al. | |
| 6,266,281 B1 | 7/2001 | Derhacobian et al. | |
| 6,347,053 B1 | 2/2002 | Kim et al. | |
| 6,418,062 B1 | 7/2002 | Hayashi et al. | |
| 6,442,075 B2 | 8/2002 | Hirano | |
| 6,483,752 B2 | 11/2002 | Hirano | |
| 6,490,205 B1 | 12/2002 | Wang et al. | |
| 6,504,762 B1 | 1/2003 | Harari | |
| 6,552,387 B1 | 4/2003 | Eitan | |
| 6,687,648 B1 | 2/2004 | Kumar et al. | |
| 6,754,109 B1 * | 6/2004 | Fastow et al. | 365/185.28 |
| 6,829,175 B2 | 12/2004 | Tsai et al. | |
| 2001/0004325 A1 | 6/2001 | Choi | |
| 2001/0043492 A1 | 11/2001 | Lee et al. | |
| 2002/0057599 A1 | 5/2002 | Miyawaki et al. | |
| 2002/0141237 A1 | 10/2002 | Goda et al. | |
| 2003/0076710 A1 | 4/2003 | Sofer et al. | |
| 2003/0179630 A1 | 9/2003 | Choi | |
| 2003/0185056 A1 | 10/2003 | Yoshida et al. | |
| 2005/0111257 A1 | 5/2005 | Eitan | |

* cited by examiner

Fig. 1

(Prior Art)

METHODS OF ERASING AND DESIGNING ELECTRICALLY ERASABLE CHARGE TRAP NONVOLATILE MEMORY CELLS HAVING ERASE THRESHOLD VOLTAGE THAT IS HIGHER THAN AN INITIAL THRESHOLD VOLTAGE

RELATED APPLICATIONS

This application is a continuation of application Ser. No. 11/128,038, filed May 12, 2005 now U.S. Pat. No. 7,170,795, entitled Electrically Erasable Charge Trap Nonvolatile Memory Cells Having Erase Threshold Voltage That is Higher Than An Initial Threshold Voltage, which is a continuation of application Ser. No. 10/401,372, filed Mar. 28, 2003 now U.S. Pat. No. 6,947,330, entitled Electrically Erasable Charge Trap Nonvolatile Memory Cells Having Erase Threshold Voltage That is Higher Than an Initial Threshold Voltage, and claims the benefit of Korean Patent Application No. 2002-0025195, filed May 8, 2002, the disclosures of all of which are hereby incorporated herein by reference in their entirety as if set forth fully herein.

FIELD OF THE INVENTION

This invention relates to nonvolatile memory devices, and more particularly to electrically erasable charge trap nonvolatile memory devices.

BACKGROUND OF THE INVENTION

Integrated circuit memory devices are widely used in consumer and commercial applications. As is well known to those having skill in the art, integrated circuit memory devices include volatile and nonvolatile memory devices. Volatile memory devices may include Dynamic Random Access Memory (DRAM) devices and Static Random Access Memory (SRAM) devices. These volatile memory devices lose their data when their power supplies are interrupted. Nonvolatile memory devices may include Masked Read-Only Memory (MROM) devices, Programmable Read-Only Memory (PROM) devices, Erasable Programmable Read-Only Memory (EPROM) devices and Electrically Erasable Programmable Read-Only Memory (EEPROM) devices. These nonvolatile memory devices retain their stored data even when their power supplies are interrupted.

As is also well known to those having skill in the art, electrically erasable nonvolatile memory devices may include floating gate devices and charge trap devices. A floating gate electrically erasable nonvolatile memory device stores charges in an isolated floating gate. A charge trap electrically erasable nonvolatile memory device stores charges in traps in a charge trapping region. These technologies are generally described in Chapter 3.5 of the textbook entitled *Semiconductor Memories: Technology, Testing, and Reliability* by Ashok K. Sharma, 1997, pp. 104-116, the disclosure of which is hereby incorporated herein by reference in its entirety as if set forth fully herein. As described therein, charge trap nonvolatile memory devices (also called charge trap EEPROMs) also may be referred to as Metal Nitride Oxide Silicon (MNOS) or (poly)Silicon Oxide Nitride Oxide Semiconductor (SONOS) devices based on the gate structures thereof.

Since the floating gate device stores charges as free carriers, all stored data may be lost if a tunnel oxide layer thereof is even partially defective. In contrast, since the charge trap device stores charges in spatially isolated traps in the charge trapping region, stored data may not be entirely lost even when a tunnel oxide layer is partially defective. Therefore, the tunnel oxide layer of a charge trap memory device may be made thinner than that of a floating gate memory device. Operational voltages of charge trap nonvolatile memory devices therefore may be lower than those of floating gate nonvolatile memory devices.

As is well known to those having skill in the art, a charge trap electrically erasable nonvolatile memory cell generally includes a transistor in an integrated circuit substrate. The transistor includes a gate having a charge trapping region therein. More specifically, the transistor may include spaced apart source and drain regions in an integrated circuit substrate, and a gate on the integrated circuit substrate therebetween. The gate may include a tunnel insulating layer on the substrate, a charge trapping region on the tunnel insulating layer, a blocking insulating layer on the charge trapping region, and a gate electrode on the blocking insulating layer.

As is well known to those having skill in the art, operation of nonvolatile memory devices can include a program operation, an erase operation and a read operation. These operations will be described with reference to FIG. 1 which graphically illustrates drain current (Id) and gate voltage (VG) for a conventional electrically erasable charge trap nonvolatile memory cell. In particular, an electrically erasable charge trap nonvolatile memory cell has an initial property that is defined by the relationship between the drain current and the gate voltage, as shown by curve 11 of FIG. 1. An initial threshold voltage $V_{Ti}$ of the memory cell may be defined from the curve 11.

Figure 1:
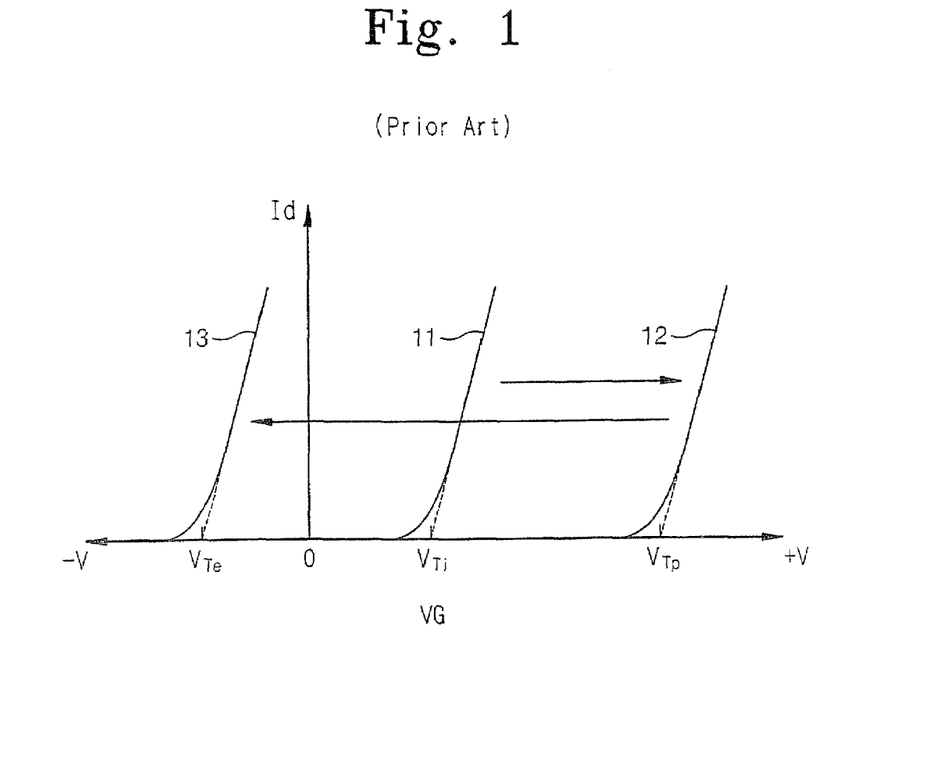
FIG. 1 graphically illustrates a relationship between drain current and gate voltage of a transistor of an electrically erasable charge trap nonvolatile memory cell to show a conventional technique for programming and erasing an electrically erasable charge trap nonvolatile memory cell.

The memory cell is initially programmed, for example, by applying a voltage of 0V to the substrate, and applying a program voltage higher than 0V to the gate electrode. As a result, electrons in a channel area between the source and drain regions are injected into deep-level traps through the tunnel insulating layer. Once programmed, the programmed cell has a predefined relationship between the drain current and the gate voltage, as shown by curve 12. As shown in FIG. 1, curve 12 is shifted towards positive gate voltage compared to curve 11. Curve 12 defines a program threshold voltage $V_{Tp}$ that is higher than the initial threshold voltage $V_{Ti}$.

In order to erase the programmed or unprogrammed cell, a reference voltage is applied to the substrate and an erase voltage, which is lower than the reference voltage, is applied to the gate electrode. As a result, electrons trapped in the charge trapping region are injected into the substrate through the tunnel insulating layer. Holes in the substrate also may be injected into the traps in the charge trapping region through the tunnel insulating layer. As shown in FIG. 1, an erased cell defines a relationship between the drain current and the gate voltage thereof, as shown by curve 13 of FIG. 1. This curve is shifted toward a negative gate voltage (−V). Thus, an erased cell has an erase threshold voltage $V_{Te}$ that is lower than the initial threshold voltage $V_{Ti}$ and which may be a negative voltage.

Programming and erasing of floating gate EEPROMs are described in U.S. Pat. No. 6,483,752 to Hirano; U.S. Pat. No. 6,442,075 to Hirano; U.S. Pat. Nos. 6,261,884; 6,347,053 to Kim et al.; U.S. Pat. No. 6,261,884 to Ho et al.; U.S. Pat. No. 6,188,609 to Sunkavalli et al.; U.S. Pat. No. 6,169,693 to Chan et al.; U.S. Pat. No. 6,160,740 to Cleveland; U.S. Pat. No. 6,054,732 to Ho et al.; U.S. Pat. No. 6,026,026 to Chan et al.; U.S. Pat. No. 5,923,589 to Kaida et al.; U.S. Pat. No. 5,790,460 to Chen et al.; and U.S. Pat. No. 5,699,298 to Shiau et al. Moreover, programming and erasing of electrically erasable charge trap nonvolatile memory cells are described in U.S. Pat. No. 6,490,205 to Wang et al.; U.S. Pat. No.

6,418,062 to Hayashi et al.; U.S. Pat. No. 6,266,281 to Derhacobian et al.; U.S. Pat. No. and 5,999,444 to Fujiwara et al.

It is well known that the erase operation can impact the endurance of the electrically erasable charge trap nonvolatile memory cell by attacking the interface between the substrate and the tunnel insulating layer during the erase operation, which may create interface traps. These interface traps may deteriorate the endurance and/or speed of an electrically erasable charge trap nonvolatile memory cell.

SUMMARY OF THE INVENTION

Some embodiments of the present invention provide an electrically erasable charge trap nonvolatile memory cell that has an initial threshold voltage, a program voltage that is higher than the initial threshold voltage, and an erase threshold voltage that is lower than the program threshold voltage but is higher than the initial threshold voltage. By allowing the erase threshold voltage to be higher than the initial threshold voltage, a reduced time interval may be used for erasing compared to conventional electrically erasable charge trap nonvolatile memory cells that have an erase voltage that is lower than the initial threshold voltage and that may be negative. By reducing the erasing time, the endurance of electrically erasable charge trap nonvolatile memory cells according to some embodiments of the invention may be increased.

Methods of erasing programmed electrically erasable charge trap nonvolatile memory cells according to some embodiments of the present invention apply an erase voltage to the gate for a time interval that is sufficient to lower a threshold voltage of the transistor from a program threshold voltage to an erase threshold voltage that is lower than the program threshold voltage, but is higher than an initial threshold voltage. According to still other embodiments of the present invention, the time interval may be determined by setting an endurance specification for a memory cell that includes a critical erase threshold voltage, a critical program threshold voltage and a critical number of erase/program cycle operations for the memory cell. An endurance test of a memory cell is performed using an initial time interval. The endurance test is repeatedly performed using a time interval that is increased or decreased from the initial time interval, to obtain the time interval that meets the endurance specification. In other embodiments, attempts are made to successfully read the memory cell using increased or decreased time intervals, after performing an endurance test.

DETAILED DESCRIPTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Moreover, each embodiment described and illustrated herein includes its complementary conductivity type embodiment as well.

Embodiments of the present invention may be used with an electrically erasable charge trap nonvolatile memory cell structure of FIG. 1, which includes a transistor in an integrated circuit substrate 1, such as a silicon semiconductor substrate. The transistor includes a gate 6 having a charge trapping region 3 therein. More specifically, the transistor can comprise spaced apart source and drain regions 7 and 7a, respectively, in the integrated circuit substrate 1 and the gate 6 on the integrated circuit substrate. The gate 6 comprises a tunnel insulating layer 2 on the substrate 1, the charge trapping region 3 on the tunnel insulating layer 2, a blocking insulating layer 4 on the charge trapping region 3, and a gate electrode 5 on the blocking insulating layer 4.

In some embodiments, the tunnel insulating layer 2 comprises oxide, the blocking insulating layer 4 comprises oxide (which may be the same as or different from the tunnel insulating layer), and the gate electrode 5 comprises conductive material. In other embodiments, the charge trapping region 3 comprises nitride. In still other embodiments, the tunnel insulating layer 2 comprises silicon dioxide, doped or undoped metallic oxide and/or doped or undoped metallic oxynitride. The charge trapping region 3 may comprise an insulator, such as silicon nitride, having deep level traps that can store charges, in which an energy band gap is narrow relative to the tunnel insulating layer 2 and the blocking insulating layer 4. The tunnel insulating layer 2 may comprise thermal oxide.

The blocking insulating layer 4 cuts off charges flowing into the charge trapping region 3 from the gate electrode 5 when operational voltages are applied to the gate electrode 5. The blocking insulating layer 4 may comprise Chemical Vapor Deposition (CVD) silicon oxide. In other embodiments, the blocking insulating layer 4 may comprise an insulator having a dielectric constant that is higher than that of silicon dioxide. For example, the blocking insulating layer 4 may comprise a metallic oxide layer and/or a metallic oxynitride layer that includes Group III or Group VB metals. In other embodiments, the metallic oxide or metallic oxynitride may be doped with a Group IV element such as Zr, Si, Ti and/or Hf. The gate electrode 5 may comprise metal, doped polysilicon or a structure of doped polysilicon and metallic silicide, also referred to as polycide.

Figure 3:
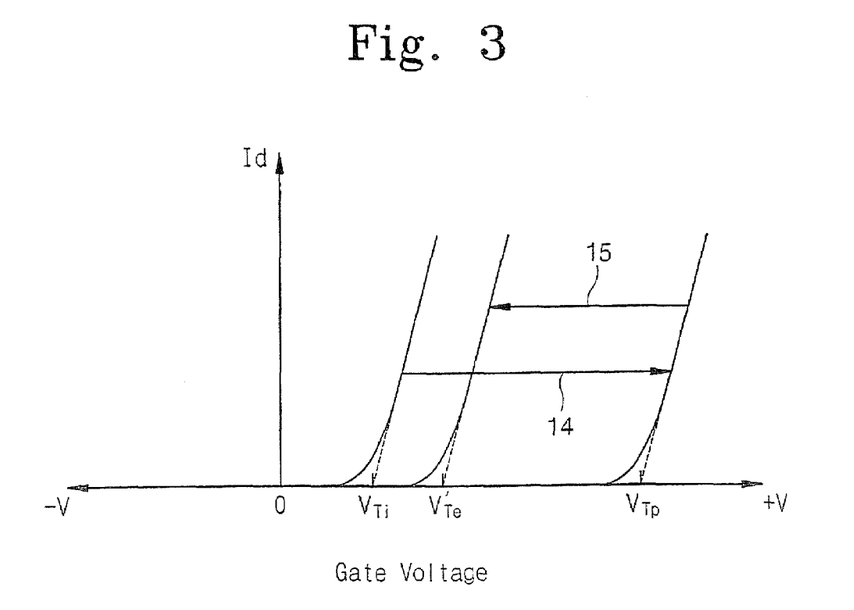
FIG. 3 is a graph of drain current versus gate voltage for electrically erasable charge trap nonvolatile memory cells according to embodiments of the present invention.

Referring now to FIG. 3, in order to program a memory cell according to some embodiments of the present invention, a voltage of 0V may be applied to the substrate 1, and a program voltage higher than 0V may be applied to the gate electrode 5. As a result, electrons in the channel tunnel through the tunnel insulating layer 2 to migrate to deep level traps in the charge trapping region 3. Accordingly, in a programming operation 14, the program threshold voltage $V_{Tp}$ is higher than the initial threshold voltage $V_{Ti}$. It will be understood that the initial threshold voltage is defined when charge is not stored in the charge trapping region and the program threshold voltage is defined when charge is stored in the charge trapping region.

In an erasing operation 15 according to embodiments of the present invention, an erase voltage, which may be of uniform or nonuniform level, is applied to the gate 5 for a time interval that is sufficient to lower the threshold voltage of the transistor from the program threshold voltage $V_{Tp}$ to an erase threshold voltage $V'_{Te}$ that is lower than the program threshold voltage $V_{Tp}$ but is higher than the initial threshold voltage $V_{Ti}$. In the erasing operation 15, at least some of the electrons in the charge trapping region 3 tunnel through the tunnel insulating layer 2 into the substrate 1 into a channel in the substrate 1 that is formed beneath the gate 6. Thus, the erase threshold voltage is defined when an erase voltage is applied to the gate 6 for a time interval that is sufficient to discharge at least some of the charge that is stored in the charge trapping region 3.

Accordingly, in order to erase an electrically erasable charge trap nonvolatile memory cell according to some embodiments of the present invention, a reference voltage is applied to the substrate 1, at least one of the programmed cells is selected, and an erase voltage is applied to the gate electrode 5 of the selected cell for a time interval that lowers the threshold voltage of the selected cell. The time interval is selected such that the erase threshold voltage $V'_{Te}$ has a higher value than the initial threshold voltage $V_{Ti}$ of the selected cell.

Without wishing to be bound by any theory of operation, since the erase threshold voltage $V'_{Te}$ is higher than the initial threshold voltage $V_{Ti}$ of the cell, some electrons may remain in the charge trapping region 3 of the cell. Thus, the number of electrons discharged into the substrate 1 by tunneling through the tunnel insulating layer 2 may be reduced, compared to the erasing operation of FIG. 1. New traps formed at an interface between the tunnel insulating layer 2 and the substrate 1 by high energy electrons that tunnel through the tunnel insulating layer 2 during an erase operation may be reduced, to enhance the endurance of the electrically erasable charge trap nonvolatile memory cell.

Methods of determining a time interval for erasing a programmed electrically erasable charge trap nonvolatile memory cell according to some embodiments of the present invention now will be described with reference to FIGS. 2, 4, 5 and 6.

Figure 4:
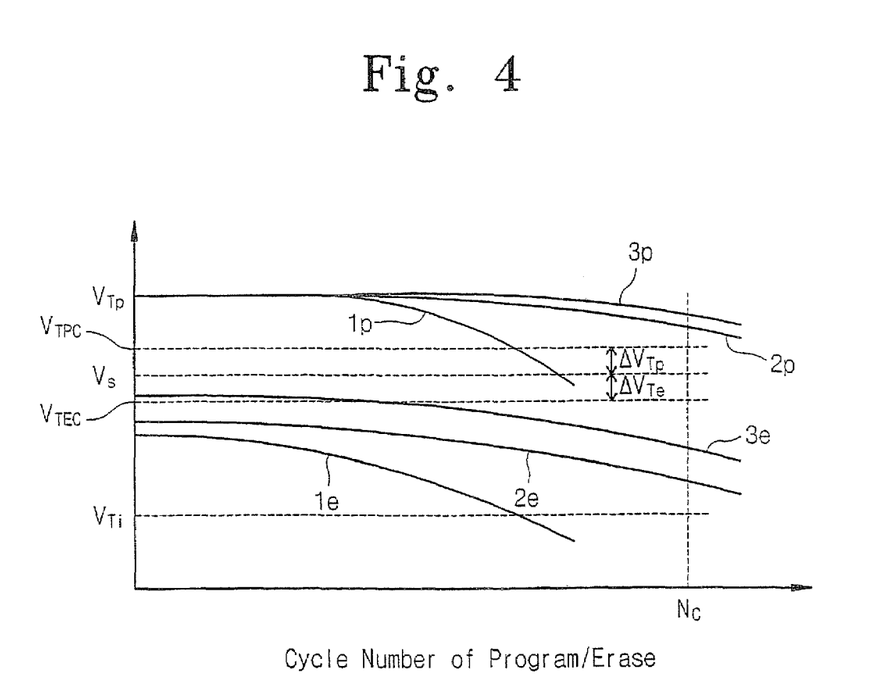
FIG. 4 graphically illustrates parameters of an endurance test for electrically erasable charge trap nonvolatile memory cells, based on an erase time interval.
Figure 5:
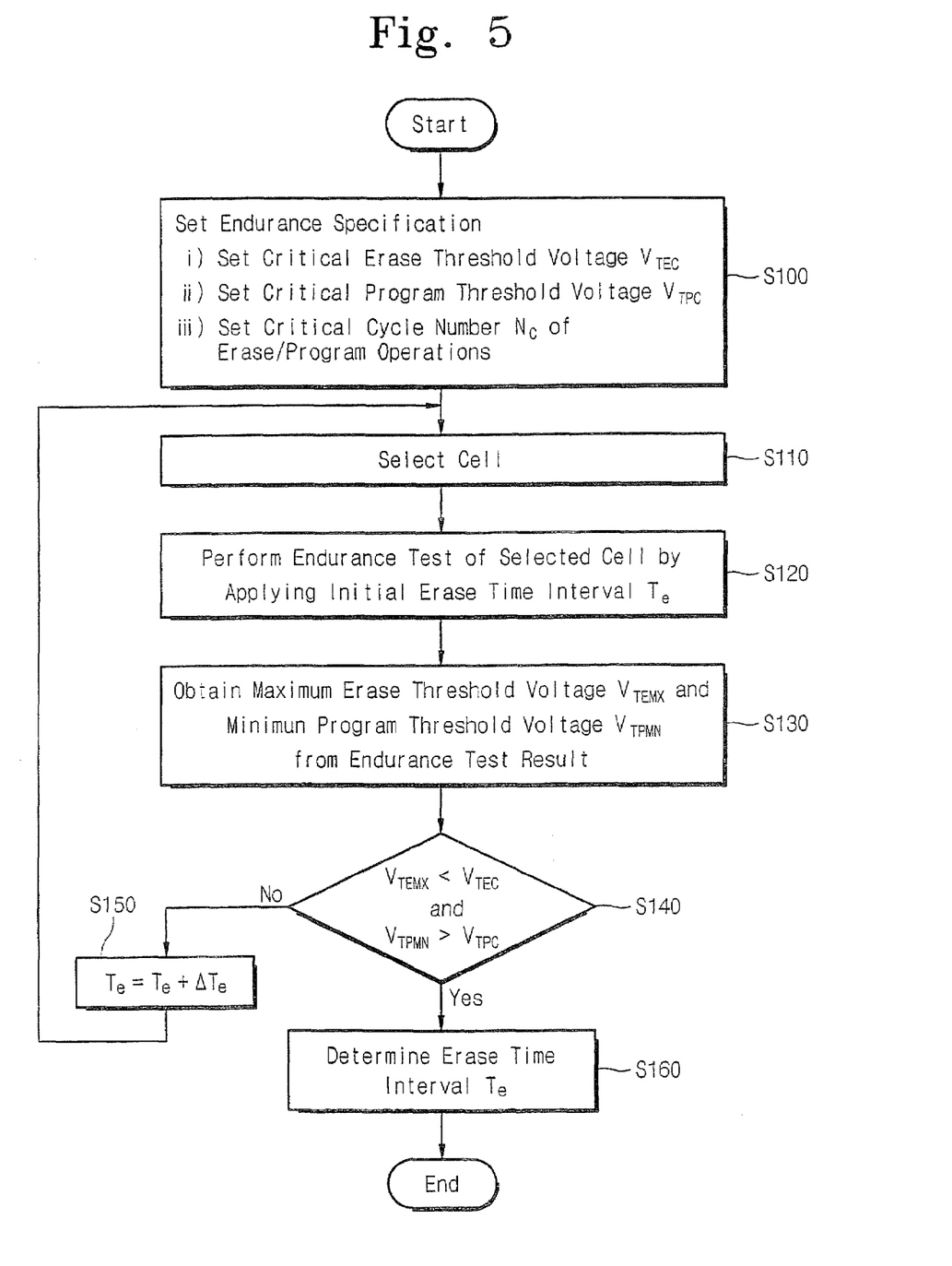
FIG. 5 is a flowchart of methods of determining a time interval for erasing a programmed electrically erasable charge trap nonvolatile memory cell according to embodiments of the present invention.
Figure 6:
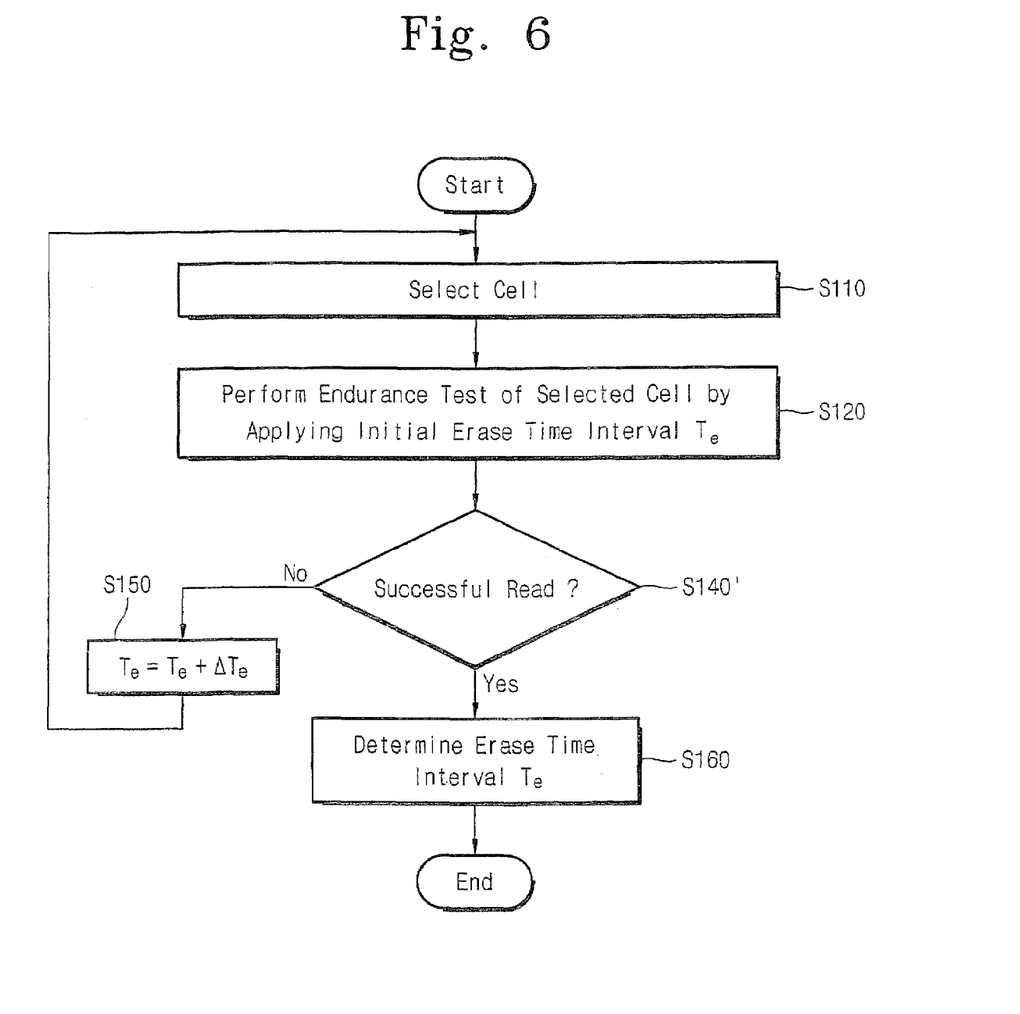
FIG. 6 is a flowchart of methods of determining a time interval for erasing a programmed electrically erasable charge trap nonvolatile memory cell according to other embodiments of the present invention.

FIG. 4 is a graph that explains an endurance test of an electrically erasable nonvolatile memory cell based on an erase time interval, in which the horizontal axis indicates the cycle number of program and erase operations and the vertical axis indicates threshold voltages of the memory cells. FIGS. 5 and 6 are flowcharts of operations for determining a time interval for erasing a programmed electrically erasable charge trap nonvolatile memory cell, according to some embodiments of the present invention.

Figure 2:
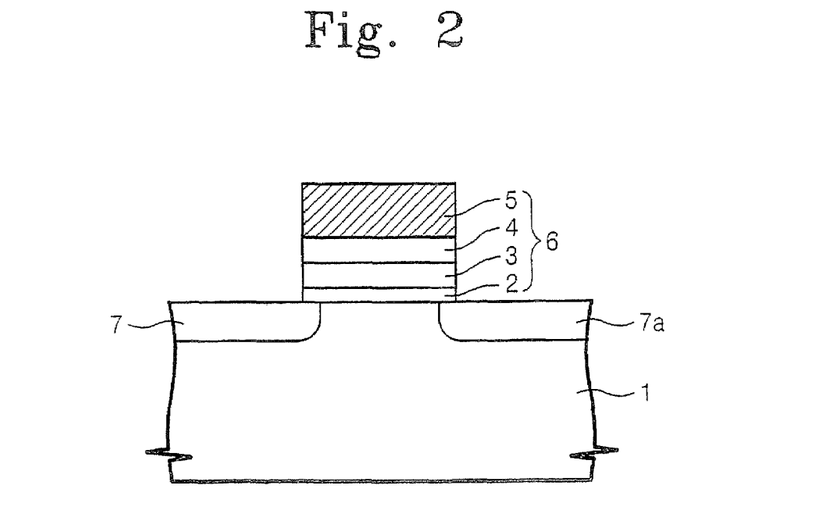
FIG. 2 is a cross-sectional view of electrically erasable charge trap nonvolatile memory cells according to embodiments of the present invention.

Referring to FIG. 2, FIG. 4 and FIG. 5, an endurance specification of the memory cell is set (Block S100). The endurance specification includes a critical erase threshold voltage $V_{TEC}$, a critical program threshold voltage $V_{TPC}$, and a critical cycle number Nc of erase/program operations. The critical erase threshold voltage $V_{TEC}$ defines a maximum allowable value for a threshold voltage of an erased cell, and the critical program threshold voltage $V_{TPC}$ defines a minimum allowable value for a threshold voltage of a programmed cell. In some embodiments, the critical erase threshold voltage $V_{TEC}$ is lower than a sensing voltage Vs, i.e., a read voltage applied to the gate electrode 5 in a read mode, and the critical program threshold voltage $V_{TPC}$ is higher than the sensing voltage Vs. That is, a voltage difference $\Delta V_{Te}$ between the critical erase threshold voltage $V_{TEC}$ and the sensing voltage Vs and a voltage difference $\Delta V_{Tp}$ between the critical program threshold voltage and the sensing voltage Vs may be set based on a sensing margin of a sense amplifier. In addition, the critical erase threshold voltage $V_{TEC}$ is defined to be higher than the initial threshold voltage $V_{Ti}$.

At least one of the cells is selected at Block S110. The endurance test is carried out by applying the critical cycle number Nc of program and erase cycles to the selected cell (Block S120). In this case, the endurance test is carried out by applying an initial erase time interval Te. The endurance test includes a step of measuring threshold voltages, i.e., an erase threshold voltage and a program threshold voltage of a cell when each erase and program cycle is completed. Thus, if the critical cycle number is 1000, 1000 erase threshold voltages $V_{Te}$ and 1000 program threshold voltages $V_{Tp}$ are measured for the initial erase time interval Te. As shown in FIG. 4, the program threshold voltage $V_{Tp}$ and the erase threshold voltage $V_{Te}$ vary as the erase/program cycles increase in number. In particular, for the electrically erasable charge trap nonvolatile memory cell shown in FIG. 2, the erase threshold voltages and the program threshold voltages gradually reduce with an increase in the number of the erase/program cycles, as shown in FIG. 4. A maximum erase threshold voltage $V_{TEMX}$ and a minimum program threshold voltage $V_{TPMN}$ are obtained from the endurance test result at Block S130.

The maximum erase threshold voltage $V_{TEMX}$ and the minimum program threshold voltage $V_{TPMN}$ are compared with the critical erase threshold voltage $V_{TEC}$ and the critical program threshold voltage $V_{TPC}$, respectively, at Block S140. If the endurance test result meets the endurance specification, the initial erase time interval Te is determined as a final erase time interval (Block S160). That is, if the maximum erase threshold voltage $V_{TEMX}$ is lower than the critical erase threshold voltage $V_{TEC}$ and the minimum program threshold voltage $V_{TPMN}$ is higher than the critical program threshold voltage $V_{TPC}$, the initial erase time interval Te corresponds to a practical minimum erase time interval, i.e., the erasing time interval that can be applied to a floating trap type nonvolatile memory device.

If the endurance test result does not meet the endurance specification, the initial erase time interval Te is increased by a predetermined time $\Delta$Te at Block S150. Thereafter, the operations of Blocks S110-S140 are repeatedly performed until the endurance test result meets the endurance specification. In this case, a final erase time corresponds to the practical minimum erase time.

In some embodiments, if the result of an endurance test performed by applying an erase time interval Te meets the endurance specification, the initial erase time interval Te may be reduced and the operations of Blocks S110-S140 may be performed until it does not meet the endurance specification.

In other embodiments, an erase time interval is determined by determining an erase time interval that allows a read operation to be performed accurately. In particular, as shown in FIG. 6, the operations of Blocks S100 and S130 of FIG. 5 do not need to be performed. Instead of Block S140 of FIG. 5, a read operation is performed using the sensing voltage Vs at Block S140'. That is, a cell whose endurance test is completed (Block S120) is read after applying the endurance test with the initial erase time interval Te. For example, the cell whose endurance test is completed is programmed (or erased) and data of the programmed (or erased) cell is read out at Block S140'. If the read operation is successfully carried out, the initial erase time interval applied to the endurance test is defined as a practical minimum erase time (Block S160). If the erase operation failed at Block S140', the operations for increasing the erase time interval Te (Block S150), the operations of Blocks S110 and S120, and the read operation of Block S140' are iteratively carried out until the read operation is successfully carried out.

In some embodiments, if the read operation is successfully carried out by applying an erase time interval Te after an endurance test is completed, the erase time interval Te is reduced at Block S150 and the operations of Blocks S110, S120 and S140' may be performed until the read operation fails.

A hypothetical result of an endurance test performed according to embodiments of the invention shown in FIG. 5 is described below with reference to FIG. 4. Returning to FIG. 4, a pair of first curves 1p and 1e correspond to the result of an endurance test performed by applying the initial erase time interval. The curve 1p indicates program threshold voltages $V_{Tp}$ measured whenever each program operation is completed during the endurance test. The curve 1e indicates erase threshold voltages $V_{Te}$ measured whenever each erase operation is completed during the endurance test. As can be seen from the curves 1p and 1e, in a case where the endurance test is performed by applying the initial erase time interval, a maximum erase threshold voltage $V_{TEMX}$ is lower than a critical erase threshold voltage $V_{TEC}$ and a minimum program threshold voltage $V_{TPMN}$ is lower than a critical program threshold voltage $V_{TPC}$. Thus, the endurance of a newly programmed cell is tested by applying a second erase time interval that is shorter than the initial erase time interval.

A pair of curves 2p and 2e indicate the result of an endurance test performed by applying the second erase time interval. As can be seen from the curves 2p and 2e, the second erase time interval meets the endurance specification. In this case, the endurance of a newly programmed cell is tested by applying a third erase time interval shorter than the second erase time interval.

A pair of third curves 3p and 3e indicate the result of the endurance test performed by applying the third erase time interval. As can be seen from the third curves 3p and 3e, a minimum program threshold voltage $V_{TPMN}$ is higher than a critical program threshold voltage and a maximum erase threshold voltage $V_{TEMX}$ is higher than a critical erase threshold voltage $V_{TEC}$. Accordingly, the third erase time interval is not appropriate as an erase time interval of the nonvolatile memory cell. As a result, if the endurance test result shown in FIG. 4 cannot be obtained, the second erase time interval is set as the erase time.

Embodiments of the invention are applicable to both a NAND-type nonvolatile memory device and a NOR-type nonvolatile memory device which include the charge trap nonvolatile memory cell. In the NAND-type nonvolatile memory device and the NOR-type nonvolatile memory device, an erasing method may be performed for each sector comprising a plurality of memory cells. In some embodiments of this erasing method, a reference voltage is applied to gate electrodes of the memory cells in the sector and an erase voltage is applied to the substrate during the erase time interval. Thus, a threshold voltage of the respective memory cells is lowered. Due to the erase time interval, values of the lowered threshold voltages are higher than those of their initial threshold voltages. As a result, the endurances of the NAND-type nonvolatile memory device and the NOR-type nonvolatile memory device may be enhanced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of erasing a programmed electrically erasable charge trap nonvolatile memory cell that includes a transistor in an integrated circuit substrate, the transistor including a gate having a charge trapping region therein, the transistor having an initial threshold voltage and a program threshold voltage that is higher than the initial threshold voltage, the erasing method comprising:
   applying an erase voltage to the gate for a time interval that is sufficient to lower a threshold voltage of the transistor from the program threshold voltage to an erase threshold voltage that is lower than the program threshold voltage but is higher than the initial threshold voltage; wherein the time interval is determined by performing the following:
   performing an endurance test of a memory cell using an initial time interval;
   attempting to successfully read the memory cell; and
   repeatedly performing the endurance test of a memory cell using a time interval that is increased or decreased from the initial time interval, based upon whether the attempting was able to successfully read the memory cell.

2. The method according to claim 1 wherein the initial threshold voltage is defined when charge is not stored in the charge trapping region and the program threshold voltage is defined when charge is stored in the charge trapping region.

3. The method according to claim 1:
   wherein the transistor comprises spaced apart source and drain regions in the integrated circuit substrate and the gate on the integrated circuit substrate therebetween; and
   wherein the gate comprises a tunnel insulating layer on the substrate, the charge trapping region on the tunnel insulating layer, a blocking insulating layer on the charge trapping region and a gate electrode on the blocking insulating layer.

4. The method according to claim 3 wherein the tunnel insulating layer comprises oxide, the blocking insulating layer comprises oxide and the gate electrode comprises conductive material.

5. The method according to claim 3 wherein the charge trapping region comprises nitride.

6. The method according to claim 4 wherein the blocking insulating layer comprises silicon dioxide, doped or undoped metallic oxide and/or doped or undoped metallic oxynitride.

7. The method according to claim 1 further comprising:
   removing the erase voltage from the gate after the time interval.

8. The method according to claim 1:
   wherein the program threshold voltage also is higher than a sensing voltage of the transistor and wherein the erase threshold voltage also is lower than the sensing voltage.

9. A method of erasing a programmed electrically erasable charge trap nonvolatile memory cell that includes a transistor in an integrated circuit substrate, the transistor including a gate having a charge trapping region therein, the transistor having an initial threshold voltage and a program threshold voltage that is higher than the initial threshold voltage, the erasing method comprising:

applying an erase voltage to the gate for a time interval that is sufficient to lower a threshold voltage of the transistor from the program threshold voltage to an erase threshold voltage that is lower than the program threshold voltage but is higher than the initial threshold voltage; wherein the time interval is determined by performing the following:

setting an endurance specification for a memory cell;

performing an endurance test of a memory cell using an initial time interval; and repeatedly performing the endurance test of a memory cell using a time interval that is increased or decreased from the initial time interval to obtain the time interval that meets the endurance specification.

10. The method according to claim 9 wherein the endurance specification includes a critical erase threshold voltage, a critical program threshold voltage and a critical number of erase/program cycle operations for the memory cell.

11. The method according to claim 10 wherein the critical erase threshold voltage is set to a value obtained by subtracting at least a sensing margin of a sense amplifier from a sensing voltage.

12. The method according to claim 10 wherein the critical erase threshold voltage is set to a value that is higher than the initial threshold voltage.

13. The method according to claim 10 wherein the critical program threshold voltage is set to a value obtained by adding at least a sensing margin of a sense amplifier to a sensing voltage.

14. The method according to claim 10:

wherein the endurance test determines a maximum erase threshold voltage and a minimum program threshold voltage; and wherein the endurance specification defines that the maximum erase threshold voltage is lower than the critical erase threshold voltage and the minimum program threshold voltage is higher than the critical program threshold voltage.

15. The method according to claim 10 wherein the endurance test is performed by applying at least the critical number of erase/program cycle operations.

16. A method of determining a time interval for erasing a programmed electrically erasable charge trap nonvolatile memory cell that includes a transistor in an integrated circuit substrate, the transistor including a gate having a charge trapping region therein, the transistor having an initial threshold voltage and a program threshold voltage that is higher than the initial threshold voltage, the time interval determining method comprising:

setting an endurance specification for a memory cell that includes a critical erase voltage that is lower than the program threshold voltage but is higher than the initial threshold voltage;

performing an endurance test of a memory cell using an initial time interval; and repeatedly performing the endurance test of a memory cell using a time interval that is increased or decreased from the initial time interval to obtain the time interval that meets the endurance specification including the critical erase voltage that is lower than the program threshold voltage but is higher than the initial threshold voltage.

17. The method according to claim 16 wherein the initial threshold voltage is defined when charge is not stored in the charge trapping region and the program threshold voltage is defined when charge is stored in the charge trapping region.

18. The method according to claim 16 wherein the endurance specification also includes a critical program threshold voltage and a critical number of erase/program cycle operations for the memory cell.

19. The method according to claim 18 wherein the critical erase threshold voltage is set to a value obtained by subtracting at least a sensing margin of a sense amplifier from a sensing voltage.

20. The method according to claim 18 wherein the critical program threshold voltage is set to a value obtained by adding at least a sensing margin of a sense amplifier to a sensing voltage.

21. The method according to claim 18:

wherein the endurance test determines a maximum erase threshold voltage and a minimum program threshold voltage; and wherein the endurance specification defines that the maximum erase threshold voltage is lower than the critical erase threshold voltage and the minimum program threshold voltage is higher than the critical program threshold voltage.

22. The method according to claim 18 wherein the endurance test is performed by applying at least the critical number of erase/program cycle operations.

23. The method according to claim 16:

wherein the program threshold voltage also is higher than a sensing voltage of the transistor and wherein the erase threshold voltage also is lower than the sensing voltage.

24. A method of determining a time interval for erasing a programmed electrically erasable charge trap nonvolatile memory cell that includes a transistor in an integrated circuit substrate, the transistor including a gate having a charge trapping region therein, the transistor having an initial threshold voltage and a program threshold voltage that is higher than the initial threshold voltage, the time interval determining method comprising:

performing an endurance test of a memory cell using an initial time interval;

attempting to successfully read the memory cell; and repeatedly performing the endurance test of a memory cell using a time interval that is increased or decreased from the initial time interval, based upon whether the attempting was able to successfully read the memory cell.

25. The method according to claim 24 wherein the initial threshold voltage is defined when charge is not stored in the charge trapping region and the program threshold voltage is defined when charge is stored in the charge trapping region.

26. The method according to claim 24 wherein the endurance test is performed by applying a critical number of erase/program cycle operations.

27. The method according to claim 24:

wherein the program threshold voltage is also higher than a sensing voltage of the transistor and wherein the erase threshold voltage is also lower than the sensing voltage.

* * * * *